United States Patent
Loh et al.

(10) Patent No.: US 7,324,982 B2
(45) Date of Patent: Jan. 29, 2008

(54) METHOD AND APPARATUS FOR AUTOMATED DEBUG AND OPTIMIZATION OF IN-CIRCUIT TESTS

(75) Inventors: Aik Koon Loh, Singapore (SG); Keen Fung Wai, Singapore (SG); Tiam Hock Tan, Singapore (SG); Roy H. Williams, Loveland, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 527 days.

(21) Appl. No.: 10/839,955

(22) Filed: May 5, 2004

(65) Prior Publication Data

US 2005/0251715 A1 Nov. 10, 2005

(51) Int. Cl.
 G06F 17/00 (2006.01)
 G06F 19/00 (2006.01)
 G06F 11/30 (2006.01)
 G06F 15/00 (2006.01)
 G06F 11/00 (2006.01)
 G06N 5/02 (2006.01)
 G21C 17/00 (2006.01)
 G01R 27/28 (2006.01)
 G01R 31/00 (2006.01)
 G01R 31/14 (2006.01)
 G01R 31/38 (2006.01)
 G01R 31/26 (2006.01)

(52) U.S. Cl. ............... 706/47; 702/117; 702/118; 702/182; 702/183; 714/26; 714/703; 714/724; 714/736; 324/158.1; 324/765

(58) Field of Classification Search ........... 702/64, 702/65, 83, 108, 117–123, 182, 183, 185, 702/186; 714/26, 703, 724, 736; 324/158.1, 324/525, 527, 605, 606, 765; 716/2–3, 5; 703/2, 13–15, 20; 706/47

See application file for complete search history.

(56) References Cited

U.S. PATENT DOCUMENTS

| | | | |
|---|---|---|---|
| 6,594,610 B1 * | 7/2003 | Toutounchi et al. | 703/14 |
| 6,707,313 B1 * | 3/2004 | Rohrbaugh et al. | 324/765 |
| 6,714,035 B2 * | 3/2004 | Witte | 324/765 |
| 7,089,139 B2 * | 8/2006 | Loh et al. | 702/117 |
| 2003/0079189 A1 * | 4/2003 | Abadir et al. | 716/4 |
| 2003/0171906 A1 * | 9/2003 | Parulkar et al. | 703/14 |

OTHER PUBLICATIONS

Yamada,A. et. al. "Automatic Test Generation for Large Digital Circuits" 1977.*
Huang,W-H. et. al. "ATPRG: An Automatic Test Program Generator Using HDL-A for Fault Diagnosis of Analog/Mixed-Signal Integrated Circuits" 1998.*
Corno,F. et. al. "Automatic Test Program Generation: A Case Study" Mar. 2004.*
Marr,D.T. "Multiprocessor Validation of the Pentium Pro" 1996.*
Schulz,M.H. et. al. "SOCRATES: A Highly Efficient Automatic Test Pattern Generation System" 1988.*
Flores,P.F. et. al. "An Exact Solution to the Minimum Size Test Pattern Problem" 2001.*
Rudnick,E.M. et. al. "Sequential Circuit Test Generation in a Genetic Algorithm Framework" 1994.*

* cited by examiner

Primary Examiner—David Vincent
Assistant Examiner—Benjamin Buss

(57) ABSTRACT

A method and apparatus for automatically debugging and optimizing an in-circuit test that is used to test a device under test on an automated tester is presented. The novel test debug and optimization technique extracts expert knowledge contained in a knowledge framework and automates the formulation of a valid stable, and preferably optimized, test for execution on an integrated circuit tester.

6 Claims, 5 Drawing Sheets

US 7,324,982 B2

METHOD AND APPARATUS FOR AUTOMATED DEBUG AND OPTIMIZATION OF IN-CIRCUIT TESTS

BACKGROUND OF THE INVENTION

The increasing reliance upon computer systems to collect, process, and analyze data has led to the continuous improvement of the system assembly process and associated hardware. With the improvements in speed and density of integrated circuits, the cost and complexities of designing and testing these integrated circuits has dramatically increased. Currently, large complex industrial integrated circuit testers (commonly referred to in the industry as "Automated Test Equipment" or "ATE") perform complex testing of integrated circuit devices, such as integrated circuits, printed circuit boards (PCBs), multi-chip modules (MCMs), System-on-Chip (SOC) devices, printed circuit assemblies (PCAs), etc. The tests that must be performed may include, among others, in-circuit test (ICT), functional test, and structural test, and are designed to verify proper structural, operational, and functional performance of the device under test (DUT).

An example of an automated test is the performance of an in-circuit test. In-circuit testing, which verifies the proper electrical connections of the components on the printed circuit board (PCB), is typically performed using a bed-of-nails fixture or robotic flying-prober (a set of probes that may be programmably moved). The bed-of-nails fixture/robotic flying-prober probes nodes of the device under test, applies a set of stimuli, and receives measurement responses. An analyzer processes the measurement responses to determine whether the test passed or failed.

A typical in-circuit test will cover many thousands of devices, including resistors, capacitors, diodes, transistors, inductors, etc. Tests are typically passed to the tester via some type of user interface. Typically, the user interface allows a technician to enter various configurations and parameters for each type of device to automatically generate tests for devices of that type. However, for various reasons, frequently a fairly significant percentage (e.g., 20%) of the automatically generated tests are faulty in that when executed on a known good device under test, the test is unable to determine the status of the device or component under test. Clearly, for devices under test that include thousands of components, this results in a large number of tests that must be manually repaired. Expert technicians typically know how to repair a broken test. However, with such a large number of "broken" tests to repair, a large (and therefore, very costly) amount of time can be spent in test debug and optimization, rather than spent in actual testing of the device itself. Accordingly, a need exists for a technique for extracting and automating the expert knowledge of test technicians to repair and optimize integrated circuit tests.

SUMMARY OF THE INVENTION

The present invention is a method and apparatus for automatically debugging and optimizing an in-circuit test that is used to test a device under test on an automated tester is presented. The novel test debug and optimization technique extracts expert knowledge contained in a knowledge framework and automates the formulation of a valid stable test for execution on an integrated circuit tester. In accordance with the invention, an in-circuit tester includes an automated test debug and optimization system which receives an integrated circuit test and performs debug and preferably optimization of the test to ensure that the test will meet at least validity and stability requirements. The automated test debug and optimization system includes an autodebug controller, which has a test formulation engine that accesses a knowledge framework associated with the device under test to formulate and package a valid stable, and preferably optimal, test for testing the device under test. The autodebug controller iterates through a number of rules associated with an active ruleset corresponding to the component to be tested by the test. The rules define actions and validation criteria, and preferably stability criteria. A newly formulated proposed test is generated based on a given rule and tested on the test head to establish whether the proposed test meets the validation criteria, and preferably the stability criteria. Once a proposed test has been found that meets the required criteria, it is preferably used to replace the originally presented test. If optimization is to be performed, the autodebug controller generates all possible proposed tests based on the knowledge framework, and selects the proposed test that best meets the validation and stability criteria.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
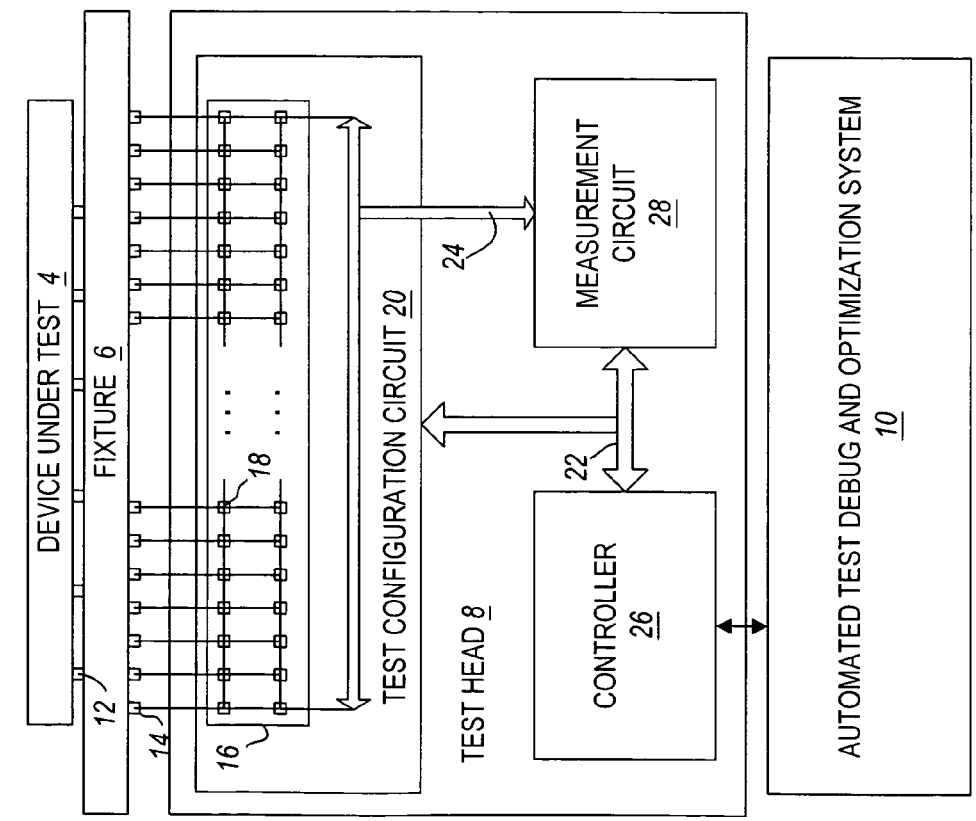
FIG. 1 is a schematic block diagram of an automated test system implemented in accordance with the invention.

Turning now to the invention, FIG. 1 is a schematic block diagram of an automated test system 2 implemented in accordance with the invention. As illustrated, test system 2 includes a test head 8 which supports a fixture 6 on which a printed circuit board (PCB) containing or implementing a device under test (DUT) 4 is mounted, and an automated test debug and optimization system 10. The test head 8 includes a controller 26, a test configuration circuit 20, and a measurement circuit 28. Fixture 6, for example a bed-of-nails fixture, is customized for each PCB layout and includes a plurality of probes 12 that electrically connect to nodes of the device under test 4 when the device under test 4 is properly seated on the fixture 6. Probes 12 are coupled via the fixture 6 to interface pins 14.

The test configuration circuit 20 includes a matrix 16 of relays 18 which is programmable via controller 26 over control bus 22 to open and/or close each relay 18 in the matrix 16 to achieve any desired connection between the interface pins 14 of the test head 8 and a set of measurement busses 24 internal to the test head 8. Measurement busses 24 are electrically connected to nodes of the measurement circuit 28. The particular nodes of measurement circuit 28 which are connected to the set of measurement busses 24 may be hardwired within the measurement circuit 28, or alternatively, may be configurable via another programmable matrix (not shown) of relays. Controller 26 receives test setup instructions from the automated test debug and optimization system 10 to program the matrix 16 (and other relay matrices, if they exist) to achieve a set of desired connection paths between the device under test 4 and measurement circuit 28. Automated test debug and optimization system 10, discussed in detail hereinafter, debugs and/or optimizes in-circuit tests to be performed on the device under test 4.

Figure 2:
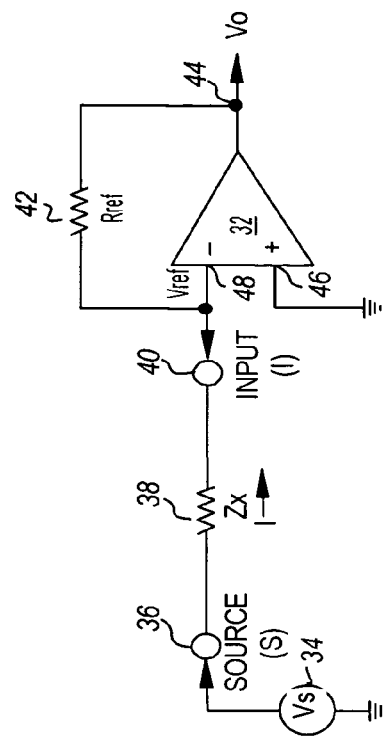
FIG. 2 is a schematic diagram of a prior art measurement circuit.

FIG. 2 illustrates and example instance 30 of a prior art measurement circuit 28. Measurement circuit 30 is known as a "two-wire" measurement circuit. Measurement circuit 30 includes operational amplifier 32 having a positive input terminal 46 coupled to ground and a negative input terminal 48 coupled to an input node I 40. A reference resistor $R_{ref}$ 42 is coupled between output node $V_O$ 44 and input node I 40 of operational amplifier 32. A component under test 38 on the DUT 4 characterized by an unknown impedance $Z_X$ is coupled between input node I 40 and a source input node S 36. The source input node S 36 is stimulated by a known reference voltage $V_S$ that is delivered by a voltage stimulus source 34. Assuming an ideal operational amplifier circuit, the current through the unknown impedance $Z_x$ of the component under test 38 should be equal to the current through reference resistor $R_{ref}$ 42 and a virtual ground should be maintained at negative input terminal 48. As is well-known in the art, in an ideal operational amplifier circuit the theoretical impedance calculation is:

$$Z_x = -R_{ref}(V_S/V_O).$$

The use of a precision DC voltage stimulus source 34 and a DC detector at output node $V_O$ 44 is employed to determine the resistive component of the output voltage when testing resistive analog components such as resistors. The use of a precision AC voltage stimulus source 34 and a phase synchronous detector at output node $V_O$ 44 is employed to determine the reactive components of the output voltage when testing reactive analog components such as capacitors and inductors.

Additional measurements, outside the scope of the present invention, are often taken to reduce guard errors and compensate for lead impedances. In order to take a set of measurements, the connection paths from the component under test 38 on the DUT 4 to the measurement circuit 28 are set up by programming the relay matrix 16 to configure the relays 18 to electrically connect the probes 12 of the bed-of-nails fixture 6 that are electrically connected to the nodes on the device under test 4 to the measurement circuit 28 via the internal measurement busses 20. In the example measurement circuit 30 of FIG. 2, the internal measurement busses include an S bus and an I bus which are respectively electrically connected to the S node 36 and I node 40. Connections of the internal measurement busses 20 from the device under test 4 to the measurement circuit 28 are programmed at the beginning of the test for the component under test 38, during the test setup. After the connections have been made, the actual test measurements of the component under test 38 may be obtained by the measurement circuit 28 after waiting for the inherent delays of the relay connections to be completed. At the conclusion of the test, the relay connections are all initialized to a known state in preparation for the start of the next test.

The measurement circuit 30 described in FIG. 2 is for purposes of example only. FIG. 2 illustrates example hardware connections, in particular, the measurement circuit 28 of FIG. 1, that must be provided by in-circuit ATE to perform the in-circuit test on a particular device, in this case as device characterized by an unknown impedance $Z_X$. It will be appreciated, however, that a typical in-circuit test will cover many thousands of devices, including resistors, capacitors, diodes, transistors, inductors, etc.

Figure 3:
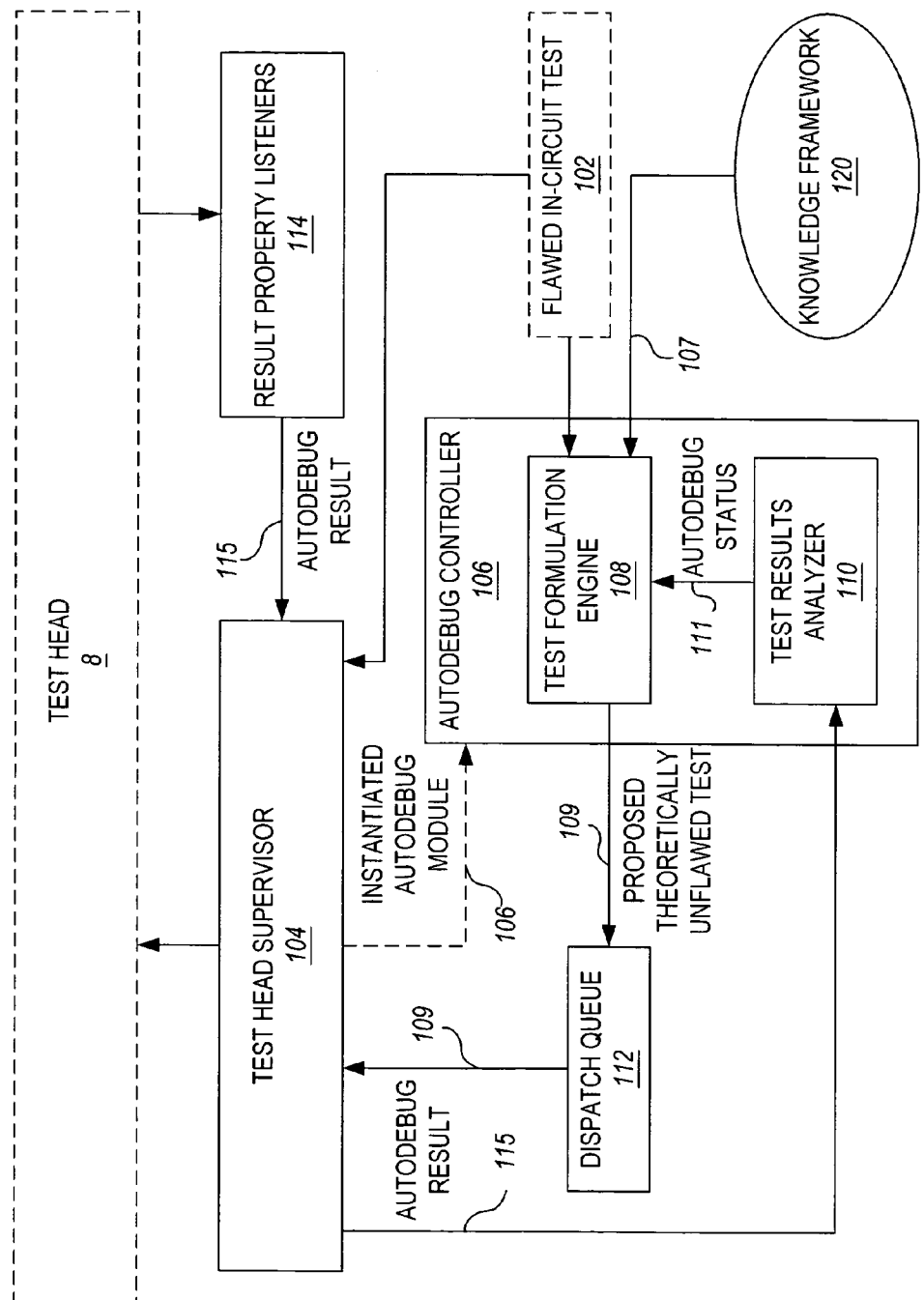
FIG. 3 is a block diagram of an automated test debug and optimization system in accordance with the invention.
Figure 6:
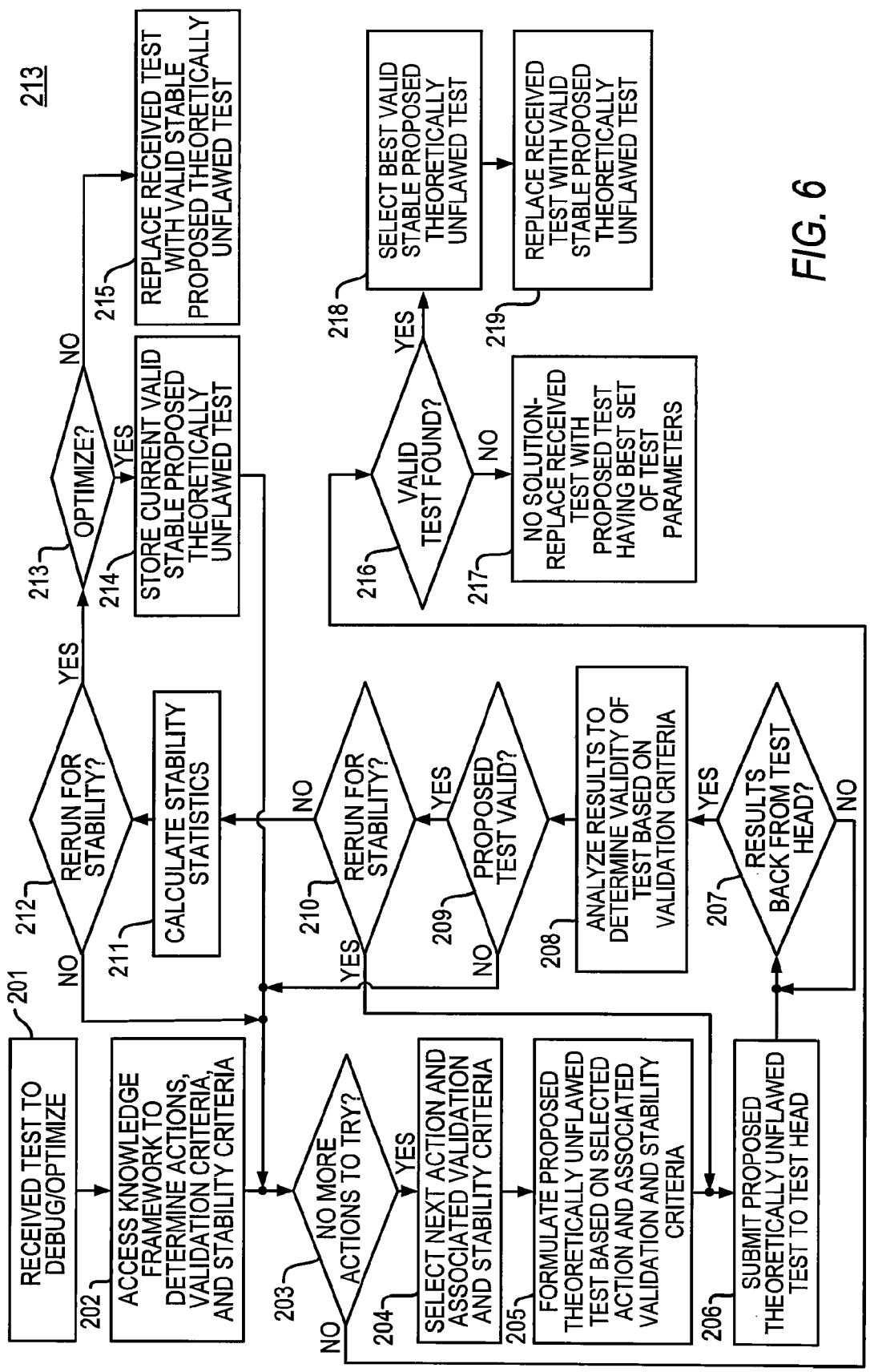
FIG. 6 is a flowchart of a method performed by the test formulation engine of the autodebug controller of the invention.

Turning now to the invention, an exemplary embodiment 100 of the automated test debug and optimization system 10 of FIG. 1 is shown in more detail in FIG. 3 and described in operation in FIG. 6. As illustrated in FIG. 3, the automated test debug and optimization system 100 preferably includes a test head supervisor 104, an autodebug controller 106, a knowledge framework 120, a dispatch queue 112, and a result property listener 114.

The test head supervisor 104 receives a test 102 for debug/optimization. The test 102 may be received from an interactive graphical user interface test setup program or from a test file input means. Below is an example of source file R208.dat for a resistor device family.

R208.dat

!!!! 2 0 1 1021582599 0000
! PG: rev 05.00pd Thu May 16 14:56:40 2002
! Common Lead Resistance 500m, Common Lead Inductance 1.00u
! Fixture: EXPRESS
disconnect all
connect s to "R208-1"; a to "R208-1"
connect i to "R208-2"; b to "R208-2"
resistor 10, 12.8, 3.75, re1, ar100m, sa, sb, en
!"r208" is a limited test.
! DUT: nominal 10, plus tol 1.00%, minus tol 1.00%
! DUT: high 10.1, low 9.9
! TEST: high limit 11.276, low limit 9.625
! Tolerance Multiplier 5.00
! Remote Sensing is Allowed The test 102 received by the tester will typically be packaged in a data structure that includes the information contained in the source file of the test to be debugged, and also other information such as device name, etc.

Typically the test 102 will be a flawed in-circuit test to be debugged/optimized such as a test that fails the component or is unable to determine status of one or more parameters of the test when tested on a known good board (i.e., when it is known that the component is good and the test should pass the component). Each test 102 tests a single individual component on the DUT 4 mounted on the tester, and is a representation of the test source file that has been prepared (i.e. compiled into object code and therefore no longer in the ASCII text readable format) to run/execute on a different processor on the test head 8.

The test head supervisor 104 is essentially an interface between the test head 8 and automated test debug and optimization system 100 whose purpose is to protect the test head resource from overloading. In the preferred embodiment, the test head 8 itself is a single processing resource; accordingly, the test head 8 can execute only a single job in any given time slot. The test head supervisor 104 operates to protect the test head by monitoring the allocation of the test head 8 resource. In the preferred embodiment, the test head supervisor 104 is implemented as a Java thread, which processes various jobs that are to be sent to the test head 8. When the test head supervisor 104 receives a test 102 to be debugged/optimized, it activates an autodebug controller 106. The method of activation depends on the particular implementation of the automated test debug and optimization system 100. For example, the autodebug controller 106 may be implemented as a static procedural function that receives the test 102 (or a pointer to the test 102) as a parameter. In yet another embodiment the autodebug controller 106 is implemented as hardware with a separate processor and memory for storing program instructions for implementing the functionality of the autodebug controller 106. In the preferred embodiment, the test head supervisor 104 instantiates an autodebug controller 106 object, passing it the received test 102, whose lifetime begins when instantiated by the test head supervisor 104 for debug/optimization and ends upon completion of the debug/optimization process for the received test 102.

The autodebug controller 106 includes a test formulation engine 108 which generates one or more proposed theoretically unflawed tests 109 that are ready for execution by the test head 8 during the lifetime of the autodebug controller 106. In generating the proposed theoretically unflawed test 109, the test formulation engine 108 accesses the knowledge framework 120 to determine the appropriate actions to take, the validation criteria, and stability criteria.

Figure 4:
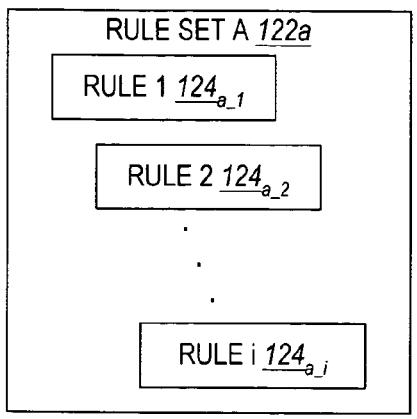
FIG. 4 is a block diagram of a knowledge framework in accordance with the invention.
Figure 4:
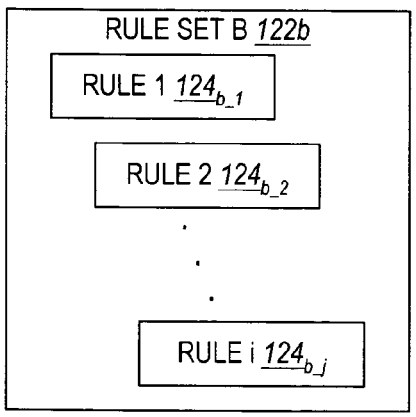
Figure 4:
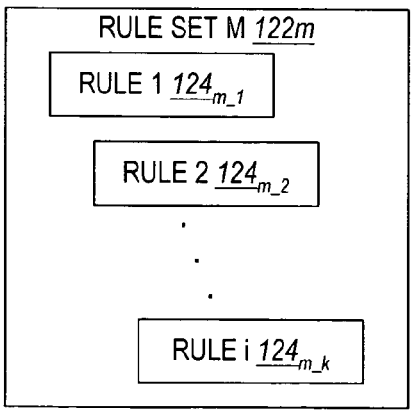
Figure 5:
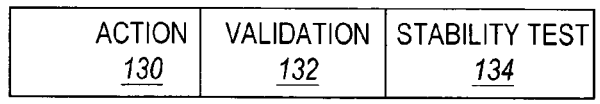
FIG. 5 is a structural diagram of a rule.

The knowledge framework 120 contains the test knowledge about the various components to be tested on the DUT 4, which allows the autodebug controller 106 to determine how to formulate and package a given test. A more detailed diagram of a preferred embodiment of the knowledge framework 120 is illustrated in FIG. 4. As shown therein, the knowledge framework 120 includes one or more rule sets $122_a, 122_b, \ldots, 122_m$. Each rule set $122_a, 122_b, \ldots, 122_m$, has associated with it one or more rules $124_{a\_1}, 124_{a\_2}, \ldots, 124_{a\_j}, 124_{b\_1}, 124_{b\_2}, \ldots, 124_{b\_i}, 124_{m\_1}, 124_{m\_2}, \ldots, 124_{m\_k}$. FIG. 5 illustrates the structure 124 of each rule $124_{a\_1}, 124_{a\_2}, \ldots, 124_{a\_i}, 124_{b\_1}, 124_{b\_2}, \ldots, 124_{b\_j}, 124_{m\_1}, 124_{m\_2}, \ldots, 124_{m\_k}$. As shown in FIG. 5, each rule preferably includes three components, including an action component 130, a validation test component 132, and a stability test component 134 (e.g., a process capability index (CPK)).

The action component 130 represents the debugging/optimization strategy. The action component 130 can implement or point to code such as library functions that are to be executed.

The validation test component 132 comprises or points to a test or algorithm that compares an expected result against the actual results measured by the tester. Typically the validation test component 132 will include many expected parameter values to be verified against the received parameter values in order to verify that the proposed theoretically unflawed test 109 passed.

The stability test component 134 is conducted to verify the robustness of a test. During operation, the stability test component 134 is only performed if the validation test passes. Stability test is conducted by applying the validity test a number of times to gather its statistical value (e.g., the process capability index CPK). The CPK is a measurement that indicates the level of stability of the formulated test derived from the knowledge framework 120.

The knowledge framework 120 includes a rule set for every possible component (e.g., resistor, car, diode, FET, inductor, etc.) to be tested on the DUT 4. The autodebug controller 106 operates at an active rule-set level. Each device/component family can have many rule sets, but at any given time, only one rule set in the knowledge framework 120 can be active. The test formulation engine 108 in the autodebug controller 106 executes only the rules in the active rule set for each device/component family.

The set of rules 124 in each rule set 122 are ordered according to a predetermined priority order. The test formulation engine 108 executes the rules within the rule set according to the predetermined priority order. In particular, the test formulation engine 108 generates a list of parameters/measurements that the test head should obtain based on the action component 130 and validation component 132 of the currently selected rule 124 of the active rule set 122. This list of parameters/measurements represents the merits of the test from which the component being tested can be classified as "good" or "bad". Other classifications are possible.

Once the test formulation engine 108 generates a proposed theoretically unflawed test 109, the proposed theoretically unflawed tests 109 is sent to a dispatch queue 112. The dispatch queue 112 stores testhead-ready tests in priority order (e.g., first-in first-out) in a queue. As the test head resource comes available, the test head supervisor 104 removes a test from the queue, and dispatches it to the test head 8 for execution.

The result property listeners 114 monitor status and data coming back from the test head 8 and packages the status and data into autodebug results 115. The autodebug results 115 comprise the test parameters that are actually measured by the test head during execution of the test. The autodebug results 115 are passed back to the test head supervisor 104, indicating that test execution on the test head 8 is complete and that the test head 8 resource is freed up for a new job. The test head supervisor 104 forwards the autodebug results 115 on to the autodebug controller 106, and if there are additional jobs waiting for dispatch to the test head 8 present in the dispatch queue 112, removes the next job from the queue 112 and allocates the test head 8 resource to execution of the next job.

The autodebug controller 106 includes a test results analyzer 110. The test results analyzer 110 processes the autodebug results 115 from the tester, comparing the actual parameters/measurements to those expected as indicated in the test validation component 132 of the rule 124 from which the proposed theoretically unflawed test 109 was generated.

If one or more of the actual test parameters does not meet the expected parameters/measurements set forth by the test validation component 132 of the rule 124 from which the proposed theoretically unflawed test 109 was generated, the test is considered bad and is discarded. If additional unprocessed rules 124 in the active rule set 122 remain to be processed, the test formulation engine 108 then selects the next highest priority rule 124 from the set 122, and generates a new proposed theoretically unflawed test 109 based on the selected new rule.

The process is repeated until a valid proposed theoretically unflawed test 109 is found. Once a valid proposed theoretically unflawed test 109 is found, then the test is re-executed one or more iterations to generate actual stability levels (e.g., CPK) and compared to the required stability criteria as set forth in the stability component 132 of the rule 124 from which the current proposed theoretically unflawed test 109 was generated. If the current proposed theoretically unflawed test 109 passes the stability test, it is considered a valid test.

If the automated test debug and optimization system 100 is configured to perform debug only, once a valid proposed theoretically unflawed test 109 is found, the valid proposed theoretically unflawed test 109 is preferably used in place of the test 102 presented for debug, and processing of the test 102 is complete.

If the automated test debug and optimization system 100 is configured to perform optimization also, the test formulation engine 108 will formulate all possible valid proposed theoretically unflawed tests 109 (that meet validity and stability tests) and will then select the particular valid proposed theoretically unflawed test 109 that best meets the validity and stability criteria. This selected "best" test is then used in place of the test 102 presented for debug, and processing of the test 102 is complete.

FIG. 6 is a flowchart illustrating the general operation of the test formulation engine 108 of the automated test debug and optimization system 100 of FIG. 3. As illustrated in FIG. 6, the test formulation engine 108 receives a test 102 to be debugged and/or optimized (step 201). The test formulation engine 108 accesses the knowledge framework 120 to determine the actions, validation criteria, and stability criteria appropriate to the component being tested by the test 102 (step 202). As discussed previously, in the preferred embodiment, the knowledge framework 120 includes one or more rule sets, each with one or more rules having associated actions, validation criteria, and stability criteria. In this preferred embodiment, the test formulation engine 108 activates the rule set corresponding to the component being tested by the test 102. The test formulation engine 108 the determines whether there are more possible actions to try in formulating a valid test, as determined from the knowledge framework 120 (step 203). If more actions exist to try in formulating a valid test, the test formulation engine 108 selects the next action and its associated validation and stability criteria (step 204). The test formulation engine 108 then formulates a proposed theoretically unflawed test 109 based on the selected action and its associated validation and stability criteria (step 205). The proposed theoretically unflawed test 109 is then submitted to the test head 8 for execution (step 206).

The test formulation engine 108 awaits results of the proposed theoretically unflawed test 109 from the test head 8 (step 207). When the results are returned from the test head 8, the test formulation engine 108 then analyzes the returned test results to determine whether the proposed theoretically unflawed test 109 is valid based on the validation criteria. As also discussed previously, generally the validation criteria consists of a series of expected parameter measurements. Accordingly, in this embodiment, the test formulation engine 108 compares the actual parameter measurements as received in the test results to the expected parameter measurements. If the actual parameter measurements meet the validation criteria (i.e., match the expected parameter measurements), the proposed theoretically unflawed test 109 is considered valid; otherwise invalid. If the proposed theoretically unflawed test 109 is not valid (determined in step 209), the test formulation engine 108 returns to step 203 to determine whether more actions are available to try.

If the proposed theoretically unflawed test 109 is valid (determined in step 209), the test formulation engine 108 determines whether or not the proposed theoretically unflawed test 109 should be rerun to collect stability measurements for the stability test (step 210). If so, the test formulation engine 108 returns to step 206 to resubmit the proposed theoretically unflawed test 109 to the test head for execution.

When running the stability test, steps 206 through 210 are repeated until a specified number of runs and/or sufficient statistical data is collected. Once the statistics are collected, the test formulation engine 108 calculates the stability statistics (step 211) and determines whether the proposed theoretically unflawed test 109 is stable based on the calculated statistics and the stability criteria specified in the knowledge framework 120 (step 212). If the proposed theoretically unflawed test 109 is not stable, the test formulation engine 108 returns to step 203 to determine whether more actions are available to try.

If the proposed theoretically unflawed test 109 is not stable, the test formulation engine 108 determines whether the test should be optimized (step 213). If not, the current valid stable proposed theoretically unflawed test 109 preferably is used in place of the received test 102 when testing the DUT 4 (step 215).

If optimization is required, the test formulation engine 108 stores the current valid stable proposed theoretically unflawed test 109 (step 214) and returns to step 203 to determine whether more actions are available to try. Steps 204 through 214 are repeated until all actions have been formulated into proposed theoretically unflawed tests and validated/invalidated and stability checks have been performed on the validated proposed theoretically unflawed tests.

When the test formulation engine 108 determines that no more actions are available to try (step 203), the test formulation engine 108 determines whether this point in the process was reached due to optimization or whether it was reached because no valid test could be found (step 216). If no valid test could be found, the test formulation engine 108 generates a status indicating that no solution to the received test 102 was found and preferably presents the "best" test in terms of parameters to be used in place of the test 102 presented for debug (step 217). If, on the other hand, the test formulation engine 108 tested all possible actions due to optimization, it selects the best valid stable proposed theoretically unflawed test based on validation criteria and how well each of the possible valid stable proposed theoretically unflawed tests meet the validation/stability criteria (step 218). The test formulation engine 108 then preferably uses the selected best valid stable proposed theoretically unflawed test in place of the received test 102 when testing the DUT 4 (step 219).

Figure 7:
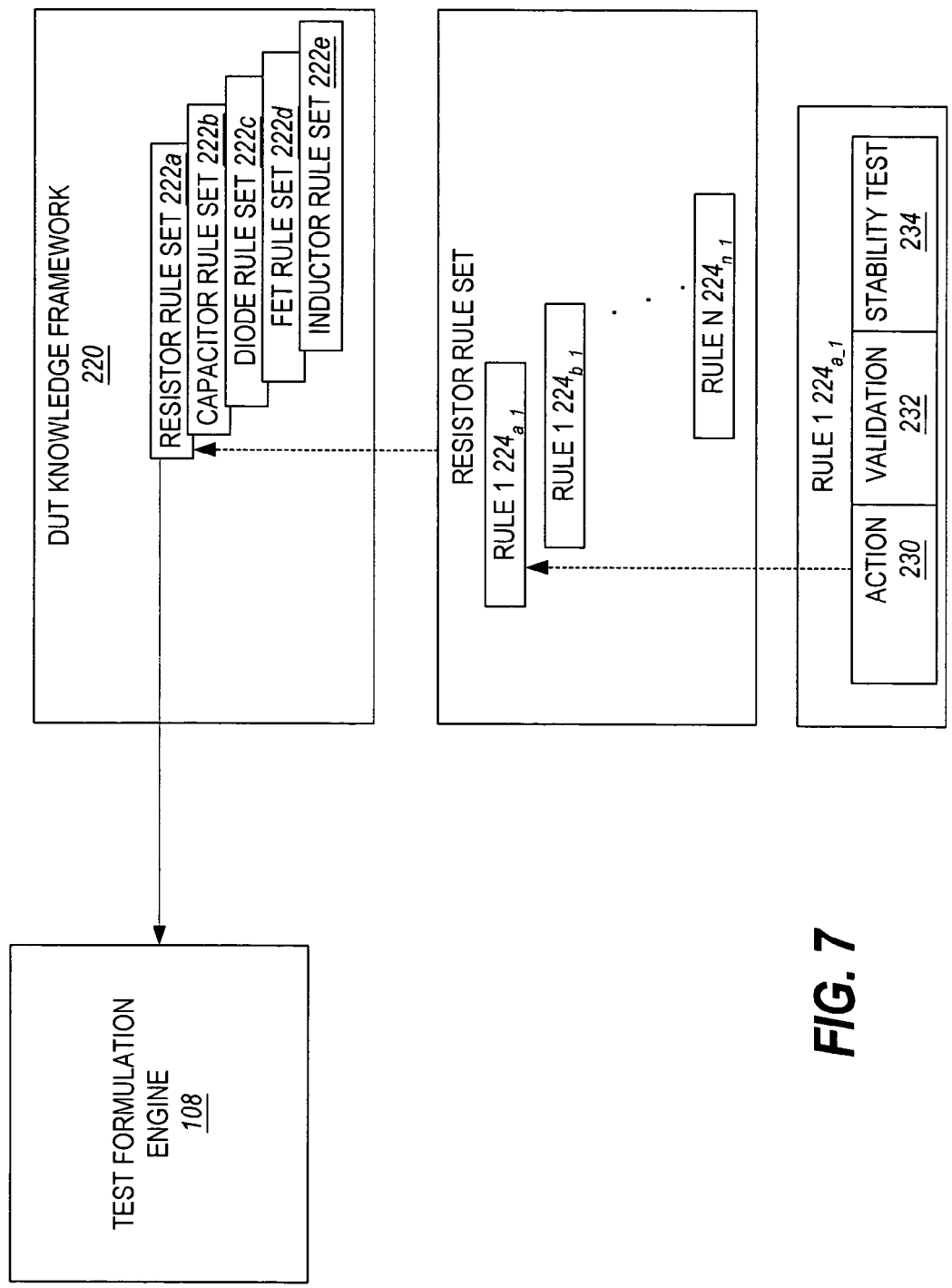
FIG. 7 is an example process diagram of an example rule set.

FIG. 7 illustrates an example knowledge framework 220 for a DUT 4 comprising a plurality of components/devices to be tested. As shown in this example, the active rule set is a resistor rule set 222a. The resistor rule set 222a includes a plurality of rules $224_{a\_1}$, $224_{a\_2}$, . . . , $224_{a\_n}$. The test formulation engine 108 processes, in priority order, each $224_{a\_1}$, $224_{a\_2}$, . . . , $224_{a\_n}$ in the active rule set, in the illustrative case, resistor rule set 222a.

Below is an example ruleset.xml file illustrating an example rule set definition file. The ruelset.xml file is an XML file that describes the relationship between the device to be tested, the rule set and the rule.

---

Ruleset.xml

---

```
<?xml version="1.0" encoding="UTF-8" ?>
- <Ruleset>
  + <Device ID="Jumper">
  + <Device ID="Resistor">
  + <Device ID="Fuse">
  - <Device ID="Capacitor">
    - <Ruleset ID="Joseph">
        <Rule ID="AutoDebug Guards" />
        <Rule ID="Set Amplitude with AutoDebug Guards" />
```

-continued

```
                          Ruleset.xml

<Rule ID="Set Amplitude" />
          </Ruleset>
        </Device>
      + <Device ID="Diode/Zener">
      + <Device ID="Transistor">
      + <Device ID="Inductor">
      + <Device ID="FET">
      + <Device ID="Switch">
      + <Device ID="Potentiometer">
      </Ruleset>
```

A key to the ruleset.xml file describing the contents is shown in TABLE 1.

TABLE 1

| Element | Attribute | Description |
|---|---|---|
| Device | ID | Name of device family. |
| Rule set | ID | Name of rule set in a device family. Rule set name is unique in a device family |
| Rule | ID | Unique identifier of a rule. |

A ruleset consists of rules in terms of running sequence priority. In any given ruleset.xml, there may be multiple rulesets defined, which means that as many rulesets may be defined as needed. Each ruleset is tagged to a specific device family. Every ruleset will contain rule(s). The ruleID is used to identify the action of the rule as found in rule.xml.

The rule.xml contains the rule database. Every rule can have its combination of actions and their associated inputs. The inputs represent localized information pertaining to this single action.

One single action can be applied to different rule with different localized content. The input is a set of criteria that control the behavior of the action algorithm. An action represents a specific set of code that is run in the test formulation engine.

Below is an example ruleset.xml file illustrating an example rule set definition file. The ruelset.xml file is an XML file that describes the relationship between the device to be tested, the rule set and the rule.

```
                          Rule.xml

<?xml version="1.0" encoding="UTF-8" ?>
      - <RuleDB>
        + <Rule ID="Set Amplitude">
        - <Rule ID="Set Amplitude with AutoDebug Guards">
          <Description value="Setting amplitude" />
          <Device ID="Capacitor" />
          <Validation-Gain maximum="10" minimum="0.0"
            name="Gain" status="True" />
          <Validation-Phase maximum="20" minimum="0.0"
            name="Phase" status="True" />
        - <Stability>
            <Status value="True" />
            <CPK value="1.0" />
            <Run value="5" />
          </Stability>
          <Merge value="False" />
          <Auto-Adjust maximum="" minimum=""
            offset-type="Percentage" type="0" />
          <Action ID="1" />
        - <Action ID="2">
            <Input ID="1" value="1" />
            <Input ID="2" value="10" />
```

-continued

```
                          Rule.xml

<Input ID="3" value="1" />
            <Input ID="4" value="1" />
            <Input ID="5" value="10" />
            <Input ID="6" value="1" />
          </Action>
        </Rule>
      + <Rule ID="AutoDebug Guards">
      + <Rule ID="Enhancement">
      + <Rule ID="Swap S and I">
      + <Rule ID="Swap S and I with AutoDebug Guard">
      </RuleDB>
```

A key to the Rule.xml file describing the contents is shown in TABLE 2.

TABLE 2

| Element | Attribute | Description |
|---|---|---|
| Rule | ID | Unique identifier of a rule. |
| Description | Value | Rule description |
| Device | ID | Device that is applicable |
| Validation-Gain | Maximum | Maximum gain value for validation purposes. |
|  | Minimum | Minimum gain value for validation purposes. |
|  | Name | Name |
|  | Status | Status of the validation item. True False |
| Validation-Phase | Maximum | Maximum phase value for validation purposes. |
|  | Minimum | Minimum phase value for validation purposes. |
|  | Name | Name |
|  | Status | Status of the validation item. True False |
| Stability | Status | Status of the validation item. True False |
|  | CPK | CPK value |
|  | Run | Number of run |
| Merge | Value | Indicator to merge with existing test source True False |
| Auto Adjust | Maximum | Maximum value for auto adjust |
|  | Minimum | Minimum value for auto adjust |
|  | Offset-Type | Offset value type Percentage Absolute |
|  | Type | Auto adjust type None Test Value Test Limit |
| Action | ID | Unique identifier for system defined action. Refer to Action Listing for the list of action |
| Input | ID | Identifier for the input type: e.g.: Lower Range Upper Range Step Resolution |
|  | Value | Value for the input type |

It will be appreciated that the above file examples are presented for purposes of example only and not limitation. The knowledge framework 120 may be implemented according to any number of different formats and structures and need only include the knowledge for actions and associated validation and optionally stability criteria that may be accessed by the autodebug controller in formulating proposed theoretically unflawed tests for a given component.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A method comprising the steps of:

receiving a test to be debugged or optimized;

in response to receiving said test,
  i) accessing a knowledge framework comprised of one or more rule sets, each rule set comprising one or more rules, and each rule comprising an action and associated validation criteria corresponding to a component to be tested;
  ii) selecting a rule from a particular rule set in said knowledge framework;
  iii) formulating a proposed test based on an action and associated validation criteria of said selected rule;
  iv) submitting said proposed test to a tester for execution;
  v) receiving results of said proposed test from said tester;
  vi) analyzing said received results in view of said validation criteria of said selected rule on which said proposed test was formulated; and
  vii) if said analyzing determines that said proposed test meets said validation criteria of said selected rule, using the proposed test in place of the test to be debugged or optimized when testing a component via a tester, else selecting a next rule in the particular rule set and repeating steps iii) through vii) with the next rule; and upon all rules in the particular rule set having been selected without one of said proposed tests meeting the validation criteria of its corresponding rule, generating a status indicating that no solution for the received test was found.

2. A method in accordance with claim 1, wherein:

said rules in said particular rule set each have an associated priority level and are selected in order of priority.

3. A method in accordance with claim 1, wherein:

said validation criteria comprises one or more expected parameter measurements;

said results comprise corresponding one or more actual parameter measurements as measured by said tester; and said analyzing step comprises comparing said one or more expected parameter measurements with said corresponding one or more actual parameter measurements; and if said one or more expected parameter measurements agree with said corresponding one or more actual parameter measurements, said proposed test is considered valid.

4. An automated debug controller, said controller comprising:

a knowledge framework comprised of one or more rule sets, each rule set comprising one or more rules, and each rule comprising an action and associated validation criteria corresponding to a component to be tested;

a test formulation engine which, in response to receiving a test to be debugged or optimized, selects a rule from a particular rule set in said knowledge framework and formulates a proposed test based on an action and associated validation criteria of said selected rule;

a tester supervisor which submits said proposed test to a tester for execution;

a results listener which listens for and receives results of said proposed test from said tester;

a test results analyzer which i) analyzes said received results in view of said validation criteria of said selected rule and replaces the test to be debugged or optimized with said proposed test if said analyzing determines that said proposed test meets said validation criteria of the selected rule, else ii) causes the test formulation engine to select a next rule in the particular rule set and formulate a new proposed test;

wherein the test formulation engine, upon all rules in the particular rule set having been selected without one of said proposed tests meeting the validation criteria of its corresponding rule, generates a status indicating that no solution for the received test was found.

5. A controller in accordance with claim 4, wherein:

said rules in said particular rule set each have an associated priority level and are selected in order of priority.

6. A controller in accordance with claim 4, wherein:

said validation criteria comprises one or more expected parameter measurements;

said results comprise corresponding one or more actual parameter measurements as measured by said tester; and said test results analyzer compares said one or more expected parameter measurements with said corresponding one or more actual parameter measurements to determine whether said proposed test is valid.

* * * * *